United States Patent
Hong et al.

(10) Patent No.: US 7,990,788 B2
(45) Date of Patent: Aug. 2, 2011

(54) REFRESH CHARACTERISTIC TESTING CIRCUIT AND METHOD FOR TESTING REFRESH USING THE SAME

(75) Inventors: Duck Hwa Hong, Seoul (KR); Sun Jong Yoo, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 338 days.

(21) Appl. No.: 12/215,459

(22) Filed: Jun. 27, 2008

(65) Prior Publication Data

US 2009/0052264 A1 Feb. 26, 2009

(30) Foreign Application Priority Data

Aug. 20, 2007 (KR) .................. 10-2007-0083696

(51) Int. Cl.
*G11C 29/00* (2006.01)
(52) U.S. Cl. .................. 365/201; 365/230.06
(58) Field of Classification Search .................. 365/149, 365/201, 202, 230.03, 185.13; 714/754
See application file for complete search history.

(56) References Cited

U.S. PATENT DOCUMENTS

| | | | | |
|---|---|---|---|---|
| 5,596,542 A * | 1/1997 | Sugibayashi et al. | .... | 365/230.06 |
| 5,680,362 A * | 10/1997 | Parris et al. | ............. | 365/230.01 |
| 6,094,389 A * | 7/2000 | Ahn | ............................... | 365/201 |
| 6,728,149 B2 * | 4/2004 | Akamatsu | ...................... | 365/200 |
| 6,853,595 B2 * | 2/2005 | Sawamura et al. | ........... | 365/195 |
| 6,928,019 B2 * | 8/2005 | Lee | ................................. | 365/222 |
| 2003/0107939 A1 * | 6/2003 | Yoon et al. | ..................... | 365/200 |
| 2007/0171743 A1 * | 7/2007 | Shin | ............................... | 365/201 |

FOREIGN PATENT DOCUMENTS

| | | |
|---|---|---|
| KR | 10-0141432 | 3/1998 |
| KR | 10-2003-0021133 A | 3/2003 |
| KR | 10-2006-0085354 A | 7/2006 |

* cited by examiner

*Primary Examiner* — Van Thu Nguyen
*Assistant Examiner* — Douglas King
(74) *Attorney, Agent, or Firm* — John P. White; Cooper & Dunham LLP

(57) ABSTRACT

A refresh characteristic test circuit is provided, in a recessed semiconductor device, that is capable of verifying whether a refresh failure is caused by the neighbor/passing gate effect or not and a method for testing the refresh characteristic. The refresh characteristic test circuit includes a select signal generating unit for receiving first address signals and a test mode signal and generate select signals to select cell blocks, a main word line signal generating unit for receiving second address signals and the test mode signal and generate main word lines signals to select main word lines of the selected cell block, and a sub word line signal generating unit for receiving third address signals and the test mode signal and enable sub word lines of the selected main word line.

7 Claims, 11 Drawing Sheets

REFRESH CHARACTERISTIC TESTING CIRCUIT AND METHOD FOR TESTING REFRESH USING THE SAME

BACKGROUND

This disclosure relates to a recessed semiconductor device and, more particularly, to a refresh characteristic test circuit capable of verifying whether a refresh failure is caused by the neighbor/passing gate effect or not and a method for testing the refresh characteristic.

Recently, as the semiconductor memory device is highly integrated and the design rule is dramatically decreased, it is more difficult to guarantee a stable operation of transistors in the memory device. For example, with the decrease of a gate in the transistor, a channel length is more decreased and the short channel effect is then caused frequently. Due to the short channel effect, the punch-through is seriously caused between a source and a drain in the highly integrated semiconductor memory device and this punch-through is mainly responsible for the malfunction of the transistor. Accordingly, various methods to guarantee the long channel without the increase of the design rule has been developed in order to overcome the short channel effect. Particularly, a recessed gate structure, which is capable of enlarging the channel length within the limited gate width, comes into the spotlight of highly integrated semiconductor memory devices, manufactured by recessing a semiconductor substrate and enlarging the channel length.

The increase of the channel length makes an amount of ions, which are implanted into the semiconductor substrate for the threshold voltage, reduced. Accordingly, the semiconductor device having the recessed gate structure can increase the refresh time, as compared to the planar gate structure. Charges stored in a capacitor of a storage node are lost due to the generation/recombination current (i.e., leakage current) which are generated by traps in a depletion region of a storage node. The refresh time can be taken by a time interval which is required to retain the information stored in a capacitor and then to sense the information in a sense amplifier.

FIG. 1 is a layout showing a cell array of a semiconductor device having a recessed gate structure. The semiconductor memory device shown in FIG. 1 having the recessed gate structure includes neighbor gates N8 to N10 and passing gates N3, N4, N11 and N12 which are inevitably required to form a cell array. The neighbor gates N8 to N10 are formed in the same region as selected gates N5 to N7 to which voltage is applied when a second word line WL2 is selected. The formation region of the passing gates N3, N4, N11 and N12 are different from that of the selected gates N5 to N7. Even if voltage is not directly applied to a first word line WL1, a third word line WL3 and a fourth word line WL4, the neighbor gates N8 to N10 and the passing gates N3, N4, N11 and N12, which are in a turn-off state, are changed into the sub-threshold state by the voltage applied to the second word line WL2 and then increase the leakage current. This leakage current increase of the neighbor gates N8 to N10 and the passing gates N3, N4, N11 and N12 is called "neighbor/passing gate effect" in the turn-off state.

However, when the neighbor/passing gate effect is caused, the leakage current which is generated by the traps is rapidly increased by the trap-assisted tunneling effect. This increase of the leakage current decreases the refresh time and causes refresh failure.

SUMMARY

This disclosure is directed to providing a refresh characteristic test circuit, in a recessed semiconductor device, capable of verifying whether a refresh failure is caused by the neighbor/passing gate effect or not and a method for testing the refresh characteristic.

According to an aspect of the disclosure, there is provided a semiconductor memory device having a refresh characteristic test circuit, the refresh characteristic test circuit comprising a select signal generating unit for receiving first address signals and a test mode signal and generate select signals to select cell blocks, a main word line signal generating unit for receiving second address signals and the test mode signal and generate main word lines signals to select main word lines of the selected cell block, and a sub word line signal generating unit for receiving third address signals and the test mode signal and enable sub word lines of the selected main word line.

The select signal generating unit generates the select signals to select all of the cell blocks of the semiconductor memory device in response to the test mode signal.

The main word line signal generating unit generates the main word line signals to select all of the main word lines of the semiconductor memory device in response to the test mode signal.

The sub word lines included in each of the main word lines are classified into at least two sub word line groups and wherein the sub word line signal generating unit simultaneously enables the sub word lines, which correspond to each of the two sub word line groups, in response to the test mode signal.

The sub word lines included in each of the main word lines are classified into at least two sub word line groups and wherein the sub word line signal generating unit simultaneously enables the sub word lines, which correspond to one of the two groups, in response to the test mode signal and then simultaneously enables the sub word lines, which correspond to the other of the two groups, in response to the test mode signal.

The select signal generating unit includes a pre-decoder for generating a plurality of pre-decoding signals by pre-decoding the first address signals in response to the test mode signal, and a decoder for generating the select signals by decoding the plurality of pre-decoding signals.

The plurality of pre-decoding signals are enabled in response to the test mode signal.

The main word line signal generating unit includes a pre-decoder for generating a plurality of pre-decoding signals by pre-decoding the second address signals in response to the test mode signal, and a decoder for generating the main word line signals by decoding the plurality of pre-decoding signals.

The plurality of pre-decoding signals are enabled in response to the test mode signal.

The sub word line signal generating unit includes a pre-decoder for generating a plurality of pre-decoding signals by pre-decoding the third address signals in response to the test mode signal, and a decoder for generating the sub word line signals by decoding the plurality of pre-decoding signals.

The pre-decoder includes a first pre-decoder for pre-decoding a part of the third address signals in response to the test mode signals and for generating first pre-decoding signals in order to select at least one of sub word line groups which are included in the main word lines, and a second pre-decoder for pre-decoding a remaining part of the third address signals and for sequentially enabling the sub word lines included in the sub word line group.

Each of the sub word line groups has the same number of the sub word lines classified from the sub word lines included in each of the main word lines.

According to still another aspect of the disclosure, there is provided a method for testing refresh characteristic in a semiconductor memory device, the method comprising steps of selecting all of the cell blocks of the semiconductor memory device, selecting all of the main word lines of the semiconductor memory device and enabling sub word lines included sub word line groups of the selected main word line.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF THE PREFERRED EMBODIMENTS

Hereinafter, the present invention will be described in detail through examples and embodiments. The examples and embodiments of course merely exemplify the present invention, and the scope of this disclosure and the appended claims are not limited by them.

A semiconductor memory device according to an example of this disclosure includes 32 cell blocks (mats), each of them includes 32 main word lines (MWLs), and each of the main word lines includes 8 sub world lines (SWLs).

Figure 1:
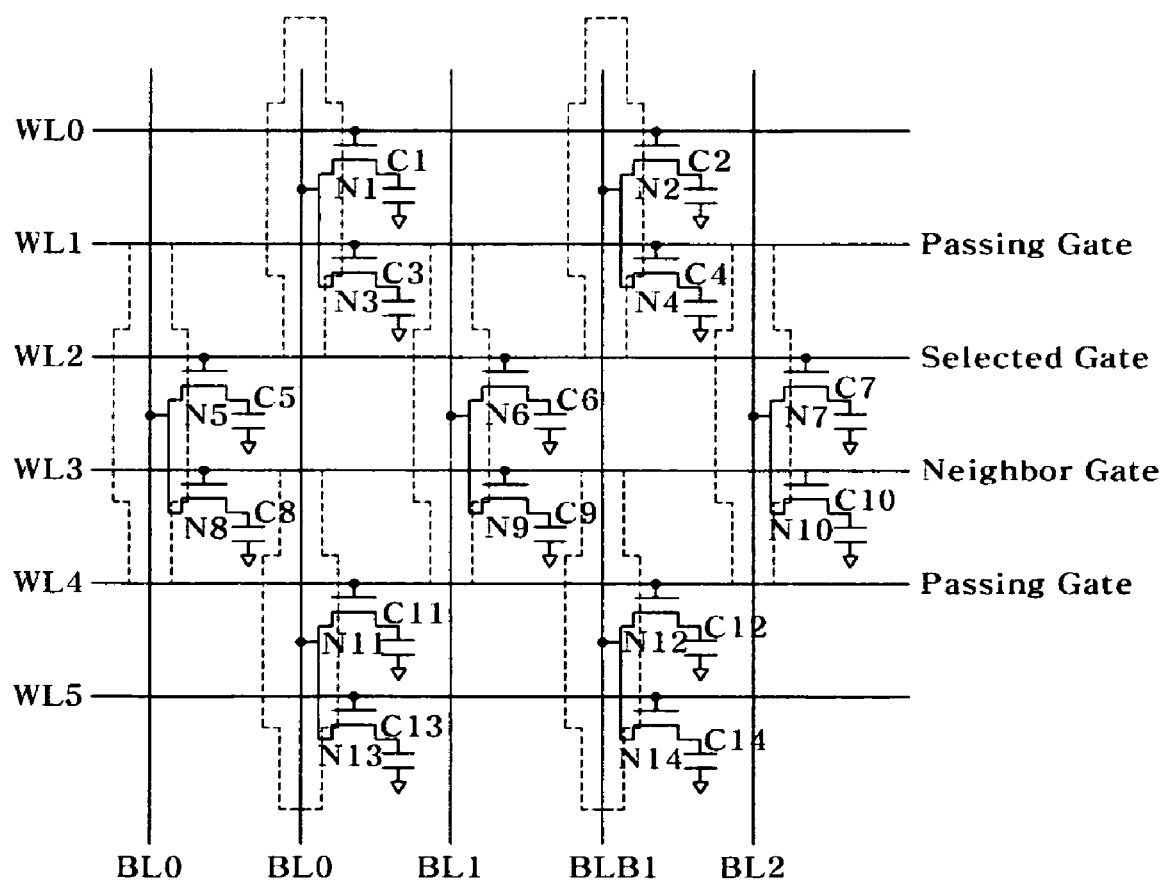
FIG. 1 is a layout showing a cell array of a semiconductor device having a recessed gate structure.
Figure 2:
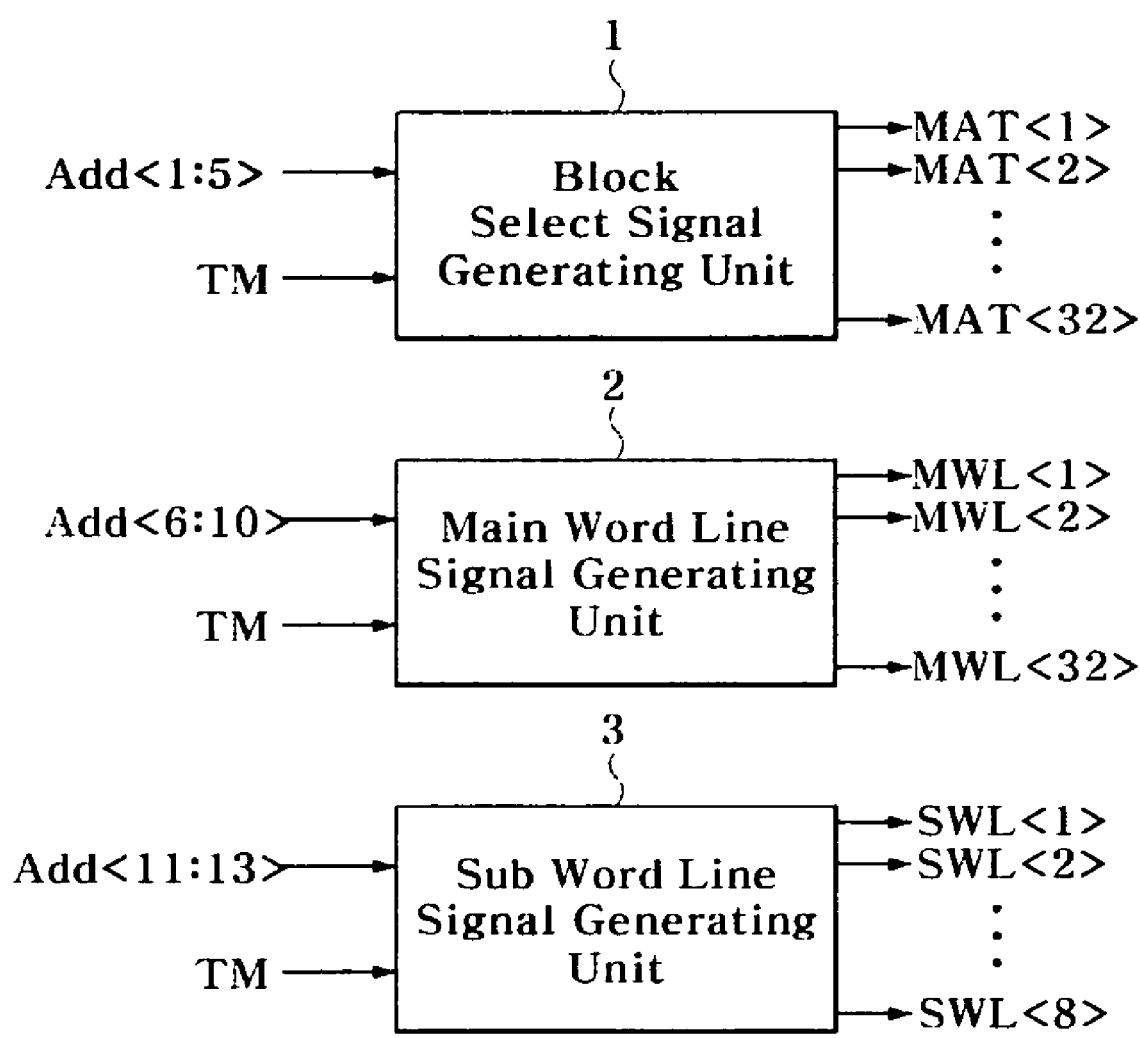
FIG. 2 is a block diagram illustrating a refresh characteristic test circuit according an embodiment of this disclosure.

Referring to FIG. 2 illustrating a refresh characteristic test circuit according to an embodiment of this disclosure, the refresh characteristic test circuit includes a block select signal generating unit 1 which receives first to fifth address signals Add<1:5> from an address signal generator (not shown) and a test mode signal TM and generates first to thirty-second block select signals MAT<1:32> for selecting a cell block, a main word line signal generating unit 2 which receives the sixth to tenth address signals Add<6:10> and the test mode signal TM and generates first to thirty-second main word line signals MWL <1:32> for selecting a main word line, and a sub word line signal generating unit 3 which receives the eleventh to thirteenth address signals Add<11:13> and the test mode signal TM and generates first to eighth sub word line signals SWL<1:8> for enabling each of the first to eight sub word lines.

Figure 3:
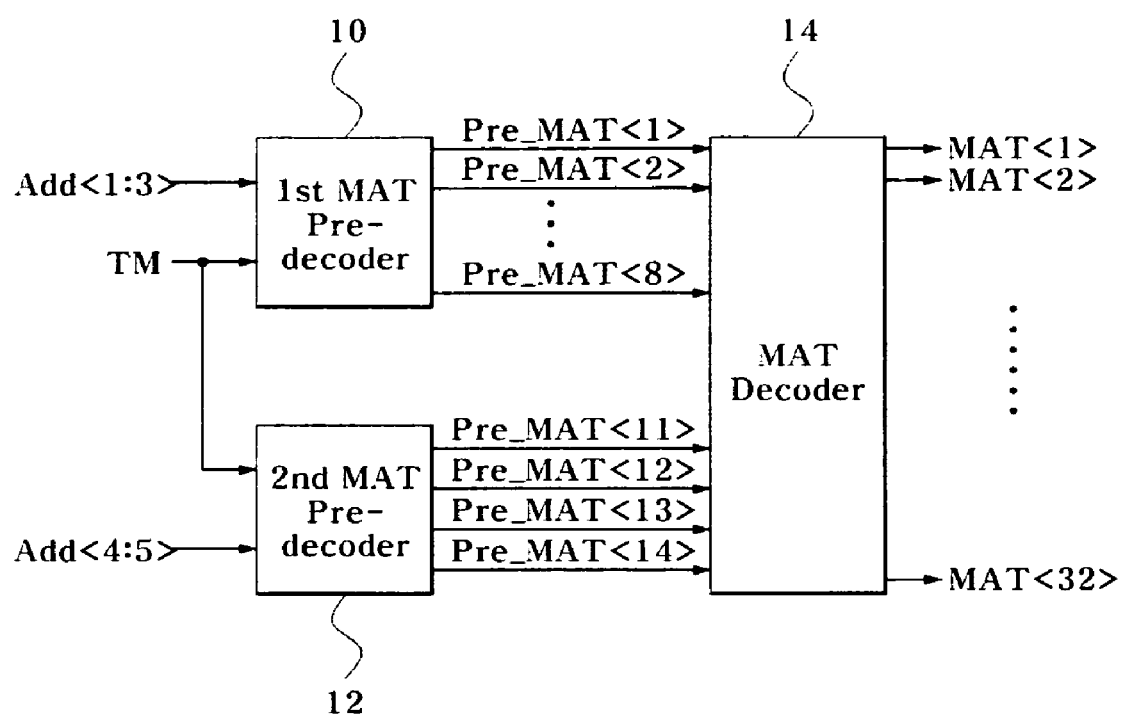
FIG. 3 is a block diagram illustrating a block select signal generating unit in the refresh characteristic test circuit of FIG. 2.

Referring to FIG. 3, the block select signal generating unit 1 includes a first mat pre-decoder 10 for receiving the first to third address signals Add<1:3> and the test mode signal TM and generate first to eighth mat pre-decoding signals Pre_MAT<1:8>, a second mat pre-decoder 12 for receiving the fourth and fifth address signals Add<4:5> and the test mode signal TM and generate eleventh to fourteenth mat pre-decoding signals Pre_MAT<11:14>, and a mat decoder 14 for decoding the first to eighth mat pre-decoding signals Pre_MAT<1:8> and the eleventh to fourteenth mat pre-decoding signals Pre_MAT<11:14> and generate the first to thirty-second block select signals MAT<1:32> to select one of thirty-two cell blocks.

Here, the mat decoder 14 is a conventional pre-decoder which receives pre-decoding signals of 8×4 signals (Pre_MAT<1:8>×Pre_MAT<11:14>) and generates thirty-two decoding signals MAT<1:32>. However, the mat decoder 14 preferably generates the first to thirty-second block select signals MAT<1:32> which are enabled in a high voltage level when all of the first to eighth mat pre-decoding signals Pre_MAT<1:8> and the eleventh to fourteenth pre-decoding signals Pre_MAT<11:14> are inputted in a high voltage level.

Figure 4:
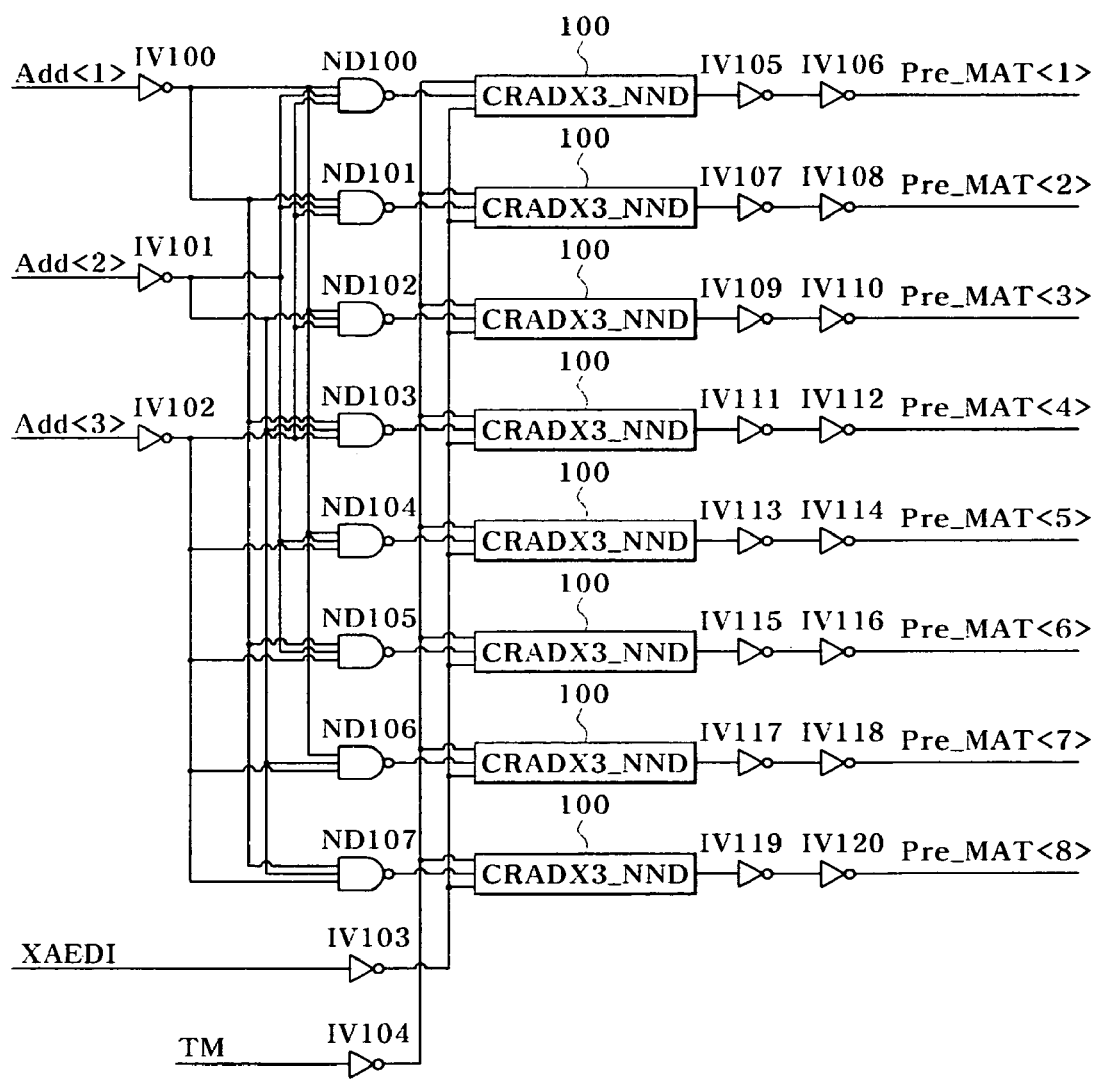
FIG. 4 is a circuit diagram illustrating a first mat pre-decoder in the block select signal generating unit of FIG. 3.

As shown in FIG. 4, the first mat pre-decoder 10 includes a plurality of NAND gates ND100 to ND107 to receive inverted signals of the first to third address signals Add<1:3>, a plurality of first signal processing units 100 to receive output signals of the plurality of NAND gates ND100 to ND107, an active signal XAEDI enabled by an active command and the test mode signal TM, and a plurality of inverters IV105 to IV120 for buffering output signals of the plurality of first signal processing units 100.

Figure 5:
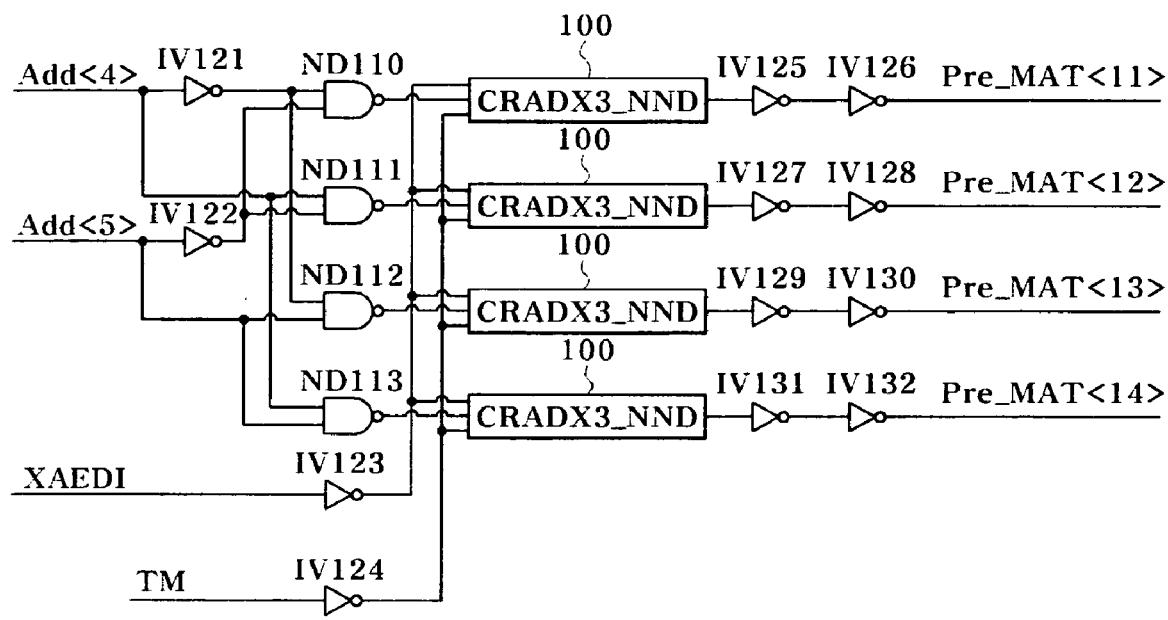
FIG. 5 is a circuit diagram illustrating a second mat pre-decoder in the block select signal generating unit of FIG. 3.

As shown in FIG. 5, the second mat pre-decoder 12 includes a plurality of NAND gates ND110 to ND113 to receive the fourth and fifth address signals Add<4:5> and inverted signals thereof, a plurality of first signal processing units 100 to receive output signals of the plurality of NAND gates ND110 to ND113, the active signal XAEDI enabled by the active command and the test mode signal TM, and a plurality of inverters IV125 to IV132 for buffering output signals of the plurality of first signal processing units 100.

Figure 6:
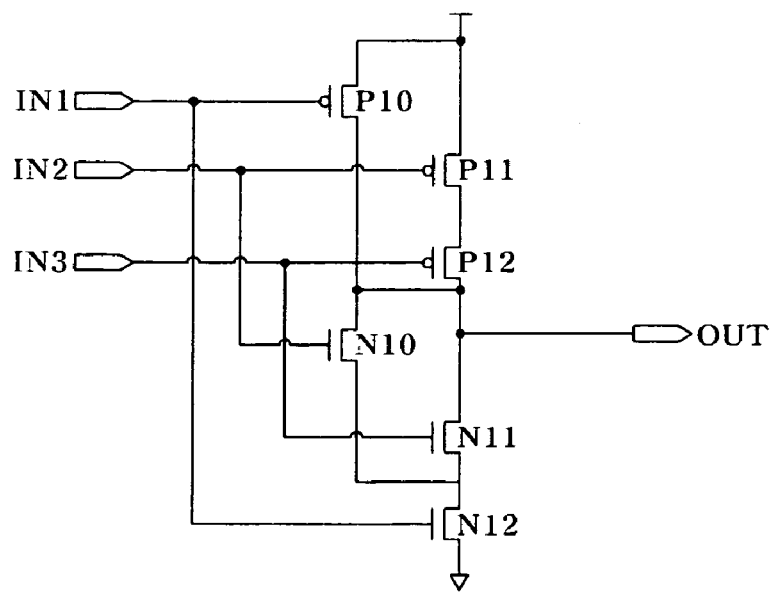
FIG. 6 is a circuit diagram illustrating a first signal processing unit shown in FIGS. 4 and 5.

Referring to FIG. 6, the first signal processing unit 100 includes PMOS transistors P10 to P12 to perform a pull-up operation of an output terminal OUT in response to received signals from first to third input terminals IN1 to IN3 and NMOS transistors N10 to N12 to perform a pull-down operation of the output terminal OUT in response to the received signals from first to third input terminals IN1 to IN3. Here, the test mode signal TM is inputted into the first input terminal IN1.

Referring to FIGS. 4 to 6, the detailed operation of the block select signal generating unit 1 will be described below.

If the test mode signal TM, which is enabled in a high voltage level, is inputted in order to screen whether the refresh failure is caused by the neighbor/passing gate effect or not, a low level signal is inputted into the first input terminal IN1 of the first signal processing unit 100 such that a high level signal is outputted at the output terminal regardless of the input signals of the second and third input terminals IN2 and IN3. Accordingly, when the test mode is carried out, the first to eighth mat pre-decoding signals Pre_MAT<1:8> generated by the first mat pre-decoder 10 and the eleventh to fourteenth mat pre-decoding signals Pre_MAT<11:14> generated by the second mat pre-decoder 120 are enabled in a high voltage level. The mat decoder 14, which receives the first to eighth mat pre-decoding signals Pre_MAT<1:8> and the eleventh to fourteenth mat pre-decoding signals Pre_MAT<11:14> all of which are enabled in a high voltage level, generates the first to thirty-second block select signals MAT<1:32> in high voltage level such that all of the blocks are selected by them.

Figure 7:
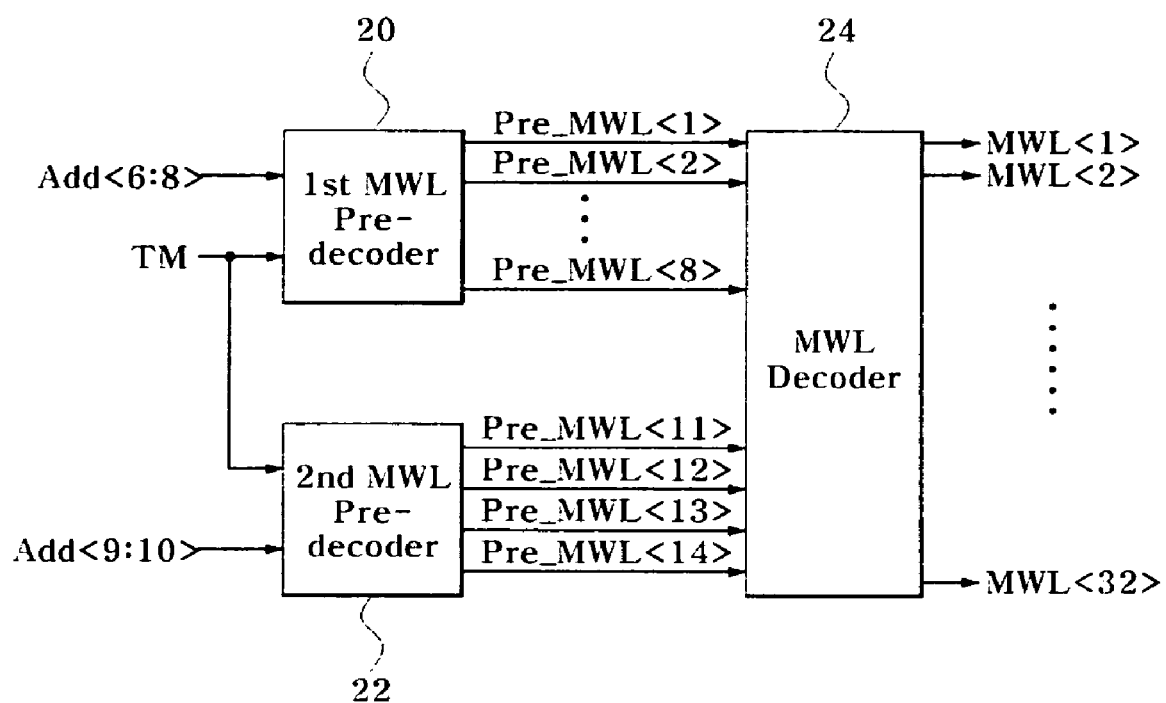
FIG. 7 is a block diagram illustrating a main word line signal generating unit in the refresh characteristic test circuit of FIG. 2.

Referring to FIG. 7, the main word line signal generating unit 2 includes a first MWL pre-decoder 20 which receives the sixth to eighth address signals Add<6:8> and the test mode signal TM and generates the first to eighth MWL pre-decoding signals Pre_MWL<1:8>, a second MWL pre-decoder 22 which receives the ninth and tenth address signals Add<9:10> and the test mode signal TM and generates the eleventh to fourteenth MWL pre-decoding signals Pre_MWL<11:14>, and a MWL decoder 24 for generating the first to thirty-second main word line signals MWL<1:32> for selecting and enabling one from thirty-two main word lines by decoding the first to eighth MWL pre-decoding signals Pre_MWL<1:8> and the eleventh to fourteenth MWL pre-decoding signals Pre_MWL<11:14>. Here, the MWL decoder 24 is a typical decoder which receives a plurality of pre-decoding signals of 8 (Pre_MWL<1:8>)×4 (Pre_MWL<11:14>) and generates thirty-two decoding signals MWL<1:32>. However, the MWL decoder 24 preferably generates the first to thirty-second main word line signals MWL<1:32> which are enabled in a high voltage level when all of the first to eighth MWL pre-decoding signals Pre_MWL<1:8> and the eleventh to fourteenth MWL pre-decoding signals Pre_MWL<11:14> are inputted in a high voltage level.

Figure 8:
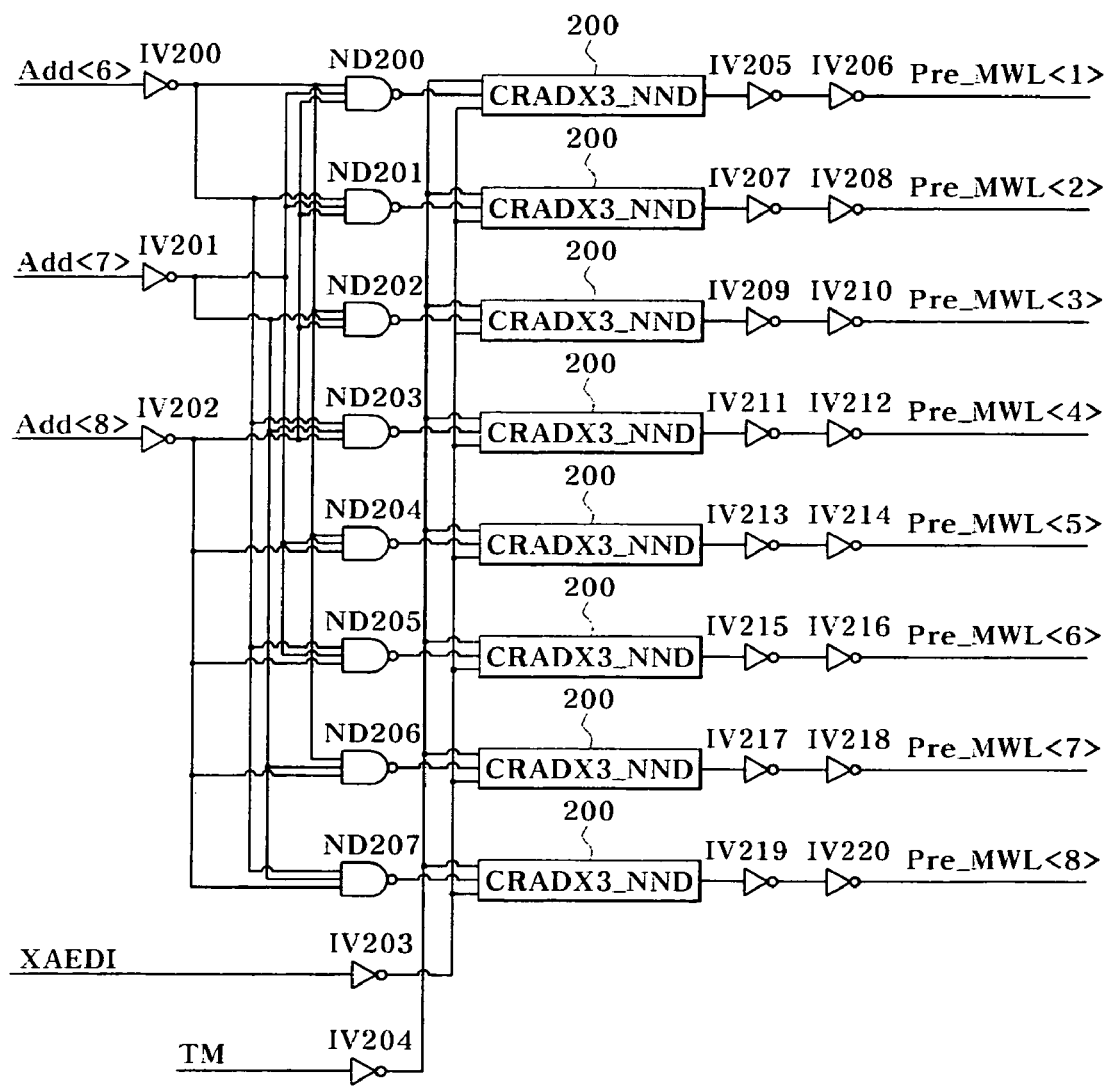
FIG. 8 is a circuit diagram illustrating a first MWL pre-decoder in the main word line signal generating unit of FIG. 7.

Referring to FIG. 8, the MWL pre-decoder 20 includes a plurality of NAND gates ND200 to ND207 to receive inverted signals of the sixth to eighth address signals Add<6:8>, a plurality of signal processing units 200 to receive output signals of the plurality of NAND gates ND200 to ND207, an active signal XAEDI enabled by the active command and the test mode signal TM, and a plurality of inverters IV205 to IV220 for buffering output signals of the plurality of signal processing units 200.

Figure 9:
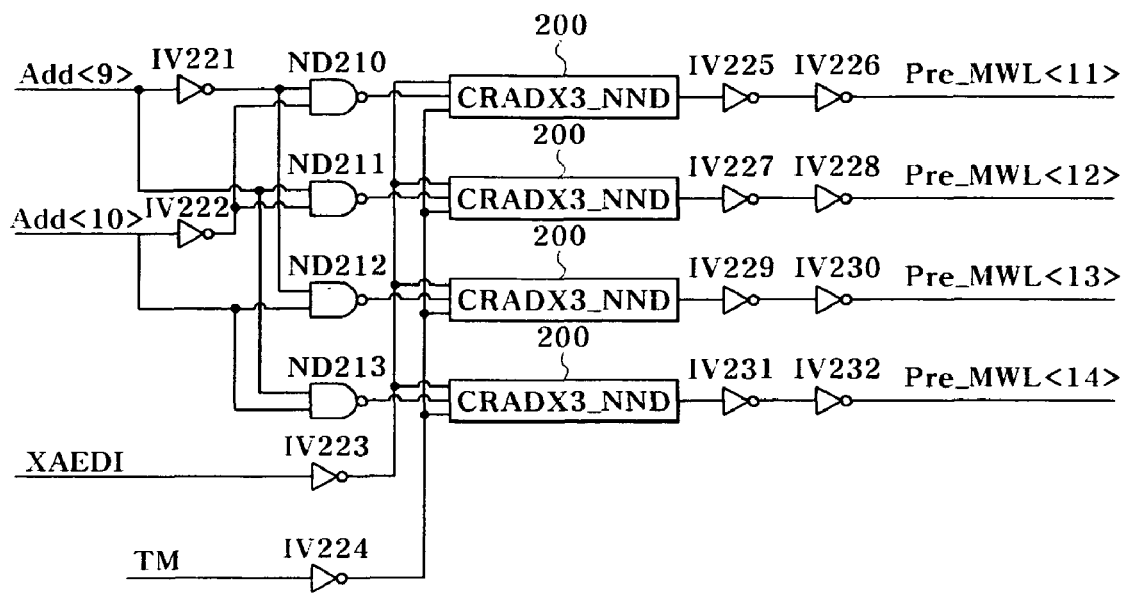
FIG. 9 is a circuit diagram illustrating a second mat pre-decoder in the main word line signal generating unit of FIG. 7.

Referring to FIG. 9, the second MWL pre-decoder 22 includes a plurality of NAND gates ND210 to ND213 to receive the ninth and tenth address signals Add<9:10> and inverted signals thereof, a plurality of signal processing units 200 to receive output signals of the plurality of NAND gates ND210 to ND213, the active signal XAEDI enabled by the active command and the test mode signal TM, and a plurality of inverters IV225 to IV232 for buffering output signals of the plurality of signal processing units 200.

Figure 10:
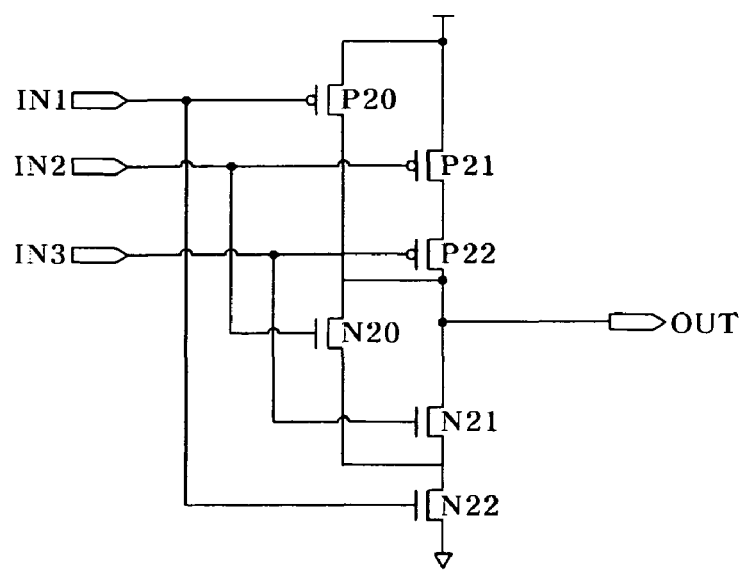
FIG. 10 is a circuit diagram illustrating a second signal processing unit of FIGS. 8 and 9.

Referring to FIG. 10, the signal processing unit 200 includes PMOS transistors P20 to P22 to perform a pull-up operation of an output terminal OUT in response to received signals from first to third input terminals IN1 to IN3 and NMOS transistors N20 to N22 to perform a pull-down operation of the output terminal OUT in response to the received signals from first to third input terminals IN1 to IN3. Here, the test mode signal TM is inputted into the first input terminal IN1.

Referring to FIGS. 8 to 10, the detailed operation of the main word line signal generating unit 2 will be described below.

If the test mode signal TM, which is enabled in a high voltage level, is inputted in order to screen whether the refresh failure is caused by the neighboring/passing gate effect or not, a low level signal is inputted into the first input terminal IN1 of the second signal processing unit 200 such that a high level signal is outputted at the output terminal regardless of the input signals at the second and third input terminals IN2 and IN3. Accordingly, when the test mode is carried out, the first to eighth MWL pre-decoding signals Pre_MWL<1:8> generated by the first MWL pre-decoder 20 and the eleventh to fourteenth MWL pre-decoding signals Pre_MWL<11:14> generated by the second MWL pre-decoder 22 are enabled in a high voltage level. The MWL decoder 24, which receives the first to eighth MWL pre-decoding signals Pre_MWL<1:8> and the eleventh to fourteenth MWL pre-decoding signals Pre_MWL<11:14> all of which are enabled in a high voltage level, generates the first to thirty-second main word line signals MWL<1:32> in high voltage level such that all of the main word lines are selected by them.

Figure 11:
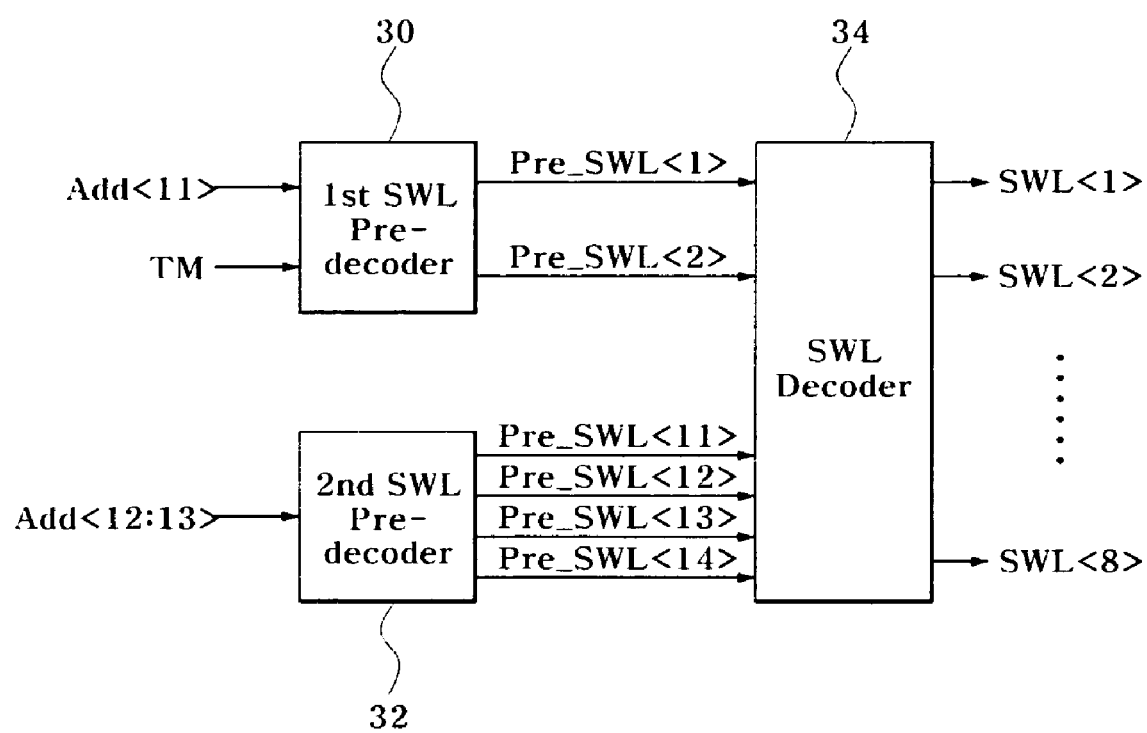
FIG. 11 is a block diagram illustrating a sub-word line signal generating unit in the refresh characteristic test circuit of FIG. 2.

Referring to FIG. 11, the sub word line signal generating unit 3 includes a SWL pre-decoder 30 which receives the eleventh address signal Add<11> and the test mode signal TM for generating first and second SWL pre-decoding signals Pre_SWL<1:2>, a second SWL pre-decoder 32 which receives the twelfth and thirteenth address signals Add<12:13> and the test mode signal TM for generating eleventh to fourteenth SWL pre-decoding signals Pre_SWL<11:14>, and a SWL decoder 34 which decodes the first to second SWL pre-decoding signals Pre_SWL<1:2> and the eleventh to fourteenth SWL pre-decoding signals Pre_SWL<11:14> for generating the first to eighth sub word line signals SWL<1:8> and then selecting and enabling two of eight sub word lines.

Figure 12:
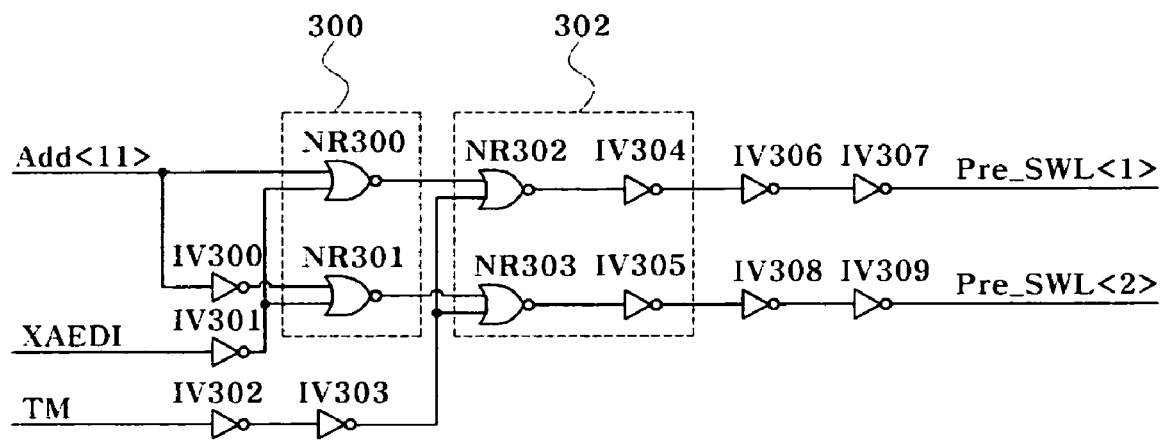
FIG. 12 is a circuit diagram illustrating a first sub-word line pre-decoder in the sub-word line signal generating unit of FIG. 11.

Referring to FIG. 12, the SWL pre-decoder 30 includes an address transfer unit 300 having NOR gates NR300 and NR301 to transfer the eleventh address signal ADD<11> in response to the active signal XAEDI, a logic unit 302 for performing a logic operation of output signals of the address transfer unit 300 and the test mode signal TM, and a plurality of inverters IV306 to IV309 for buffering output signals of the logic unit 302.

Figure 13:
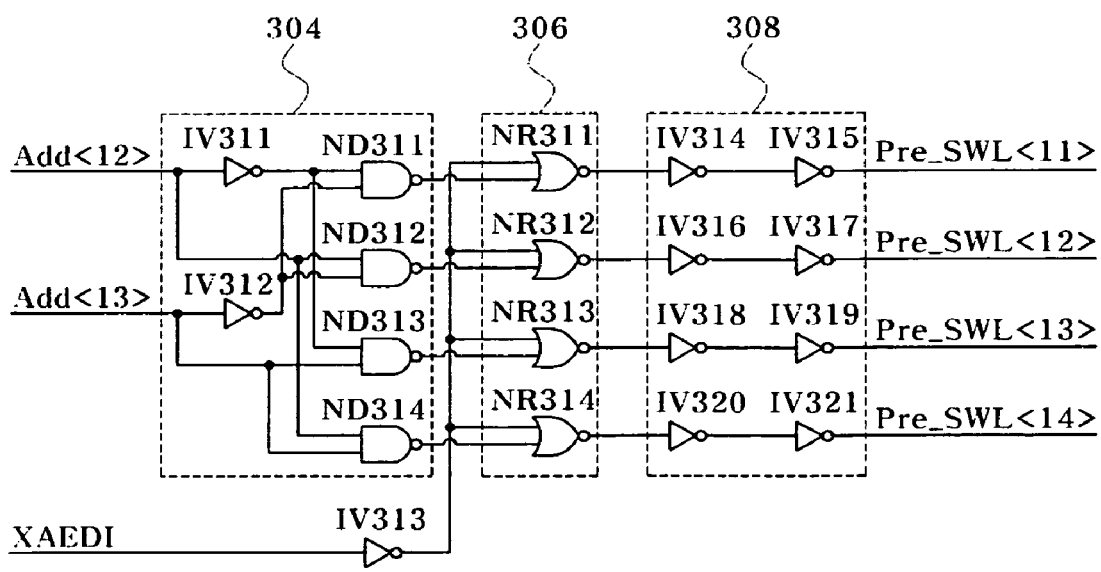
FIG. 13 is a circuit diagram illustrating a second sub-word line pre-decoder in the sub-word line signal generating unit of FIG. 11.

The second SWL pre-decoder 32, as shown in FIG. 13, is a typical decoder which produces four decoding signals by combining the twelfth and thirteenth address signals Add<12:13>.

Referring again to FIG. 11, the SWL decoder 34 receives the first and second pre-decoding signal Pre_SWL<1:2> and the eleventh to fourteenth SWL pre-decoding signals Pre_SWL<11:14> and then generates the first to eighth sub word line signals SWL<1:8> to enable the first to eighth sub word lines, respectively. Here, the first to eighth sub word line signals SWL<1:8> can be classified into two groups, the first group of the first to fourth sub word line signals SWL<1:4> and the second group of the fifth to eighth sub word line signals SWL<5:8>. In the recessed gate structure of the semiconductor memory device, this classification of the sub word lines, the first group and the second group, is prepared to consider the neighbor/passing gate effect. That is, when the voltage is applied to one sub word line and the sub word line is then enabled, the voltage-applied sub word line has effects on other 3 sub word lines.

The SWL decoder 34 is set up to select the first group when the first SWL pre-decoding signal Pre_SWL<1> is in a high voltage level and to select the second group when the second SWL pre-decoding signal Pre_SWL<2> is in a high voltage level. The sub word lines included in the selected group is enabled by the eleventh to fourteenth SWL pre-decoding signals Pre_SWL<11:14>, for example, the first sub word line signal SWL<1> of the first group and the fifth sub word line signal SWL<5> of the second group are enabled in a high voltage level when the eleventh SWL pre-decoding signal Pre_SWL<11> is enabled in a high voltage level, the second sub word line signal SWL<2> of the first group and the sixth sub word line signal SWL<6> of the second group are enabled in a high voltage level when the twelfth SWL pre-decoding signal Pre_SWL<12> is enabled in a high voltage level, the third sub word line signal SWL<3> of the first group and the seventh sub word line signal SWL<7> of the second group are enabled in a high voltage level when the thirteenth SWL pre-decoding signal Pre_SWL<13> is enabled in a high voltage level, and the fourth sub word line signal SWL<4> of the first group and the eighth sub word line signal SWL<8> of the second group are enabled in a high voltage level when the fourteenth SWL pre-decoding signal Pre_SWL<14> is enabled in a high voltage level.

Referring to FIGS. 12 and 13, the detailed operation of the sub word line signal generating unit 3 will be described below.

If the test mode signal TM, which is enabled in a high voltage level, is inputted in order to screen whether the refresh failure is caused by the neighboring/passing gate effect or not, all of the first and second SWL pre-decoding signal Pre_SWL<1:2> are in a high voltage level. Accordingly, the first and second groups are selected.

Also, since the cell is activated while the test is carried out, the active signal XAEDI is in a high voltage level so that the second pre-decoder 32 performs the decoding operation for generating the eleventh to fourteenth SWL pre-decoding signals Pre_SWL<11:14> using the combination of the twelfth and thirteenth address signals Add<12:13>. For example, in case that each of the twelfth and thirteenth address signals Add<12:13> is in a low voltage level, the eleventh SWL pre-decoding signal Pre_SWL<11> is enabled in a high voltage level and, in case that the twelfth and thirteenth address signals Add<12:13> are in low and high voltage levels, respectively, the thirteenth SWL pre-decoding signal Pre_SWL<13> is enabled in a high voltage level.

That is, in the test mode, two sub word lines included in one main word line are simultaneously enabled. At this time, the first and fifth sub word lines which are simultaneously enabled do not have influence of the applied voltage on each other.

Figure 14:
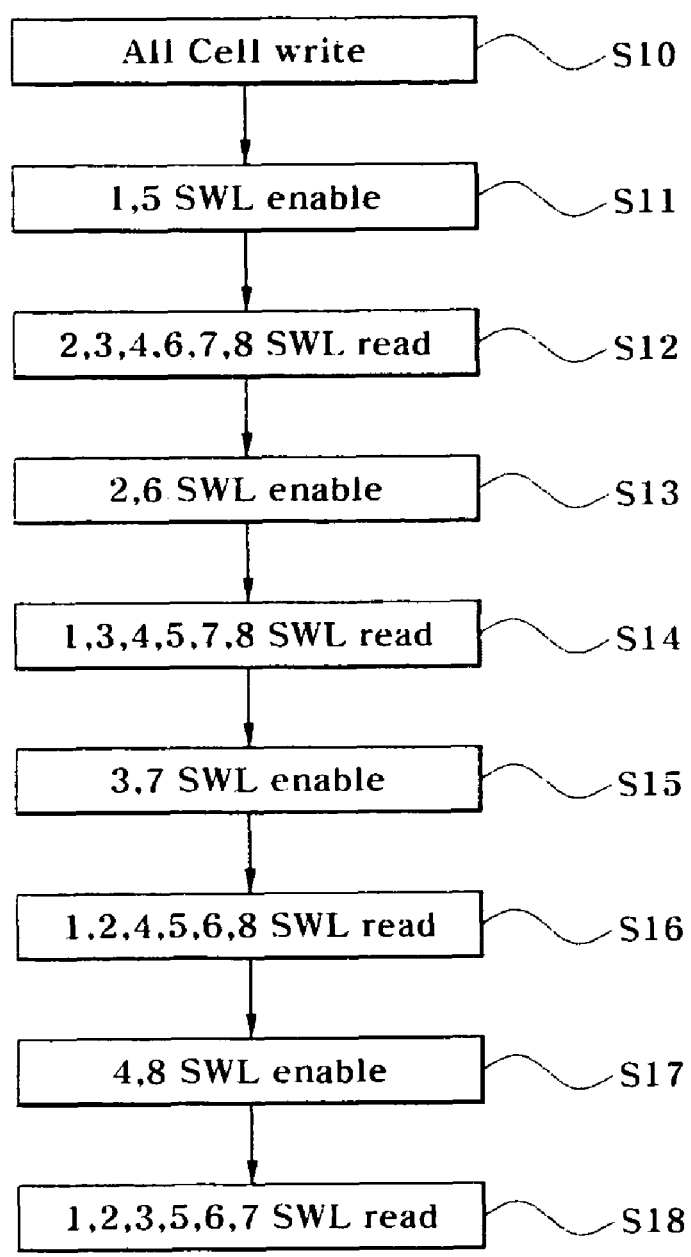
FIG. 14 is a flow chart showing a method for testing a refresh characteristic according to an embodiment of this disclosure.

As mentioned above, the refresh failure can be screened through the refresh characteristic test when the neighbor/passing gate effect is caused. Hereinafter, a method for testing the refresh characteristic will be described in detail referring to FIG. 14.

At step S10, all of the memory cells included in the semiconductor memory device are written with high level data. At this time, the high level data are written by a typical write operation of the semiconductor memory device.

Next, at step S1, the first and fifth sub word lines are enabled by the refresh characteristic circuit according to the present invention. More concretely, the first to thirty-second block select signals MAT<1:32>, which are generated by the test mode signal TM of a high voltage level in the block select signal generating unit 1, are enabled in a high voltage level so that all of the blocks included in the semiconductor memory device are selected. Also, the first to thirty-second main word line signals MWL<1:32>, which are generated by the test mode signal TM of a high voltage level in the main word line signal generating unit 2, are enabled in a high voltage level so that all of the main word lines included in the semiconductor memory device are selected.

The test mode signal TM of the high voltage level is inputted into the sub word line signal generating unit 3 so that the first and second SWL pre-decoding signals Pre_SWL<1:2> are enabled in a high voltage level. The first and second SWL pre-decoding signals Pre_SWL<1:2> of the high voltage level is inputted into the SWL decoder 34 so that all of the first and second groups are selected in order that the fifth to eighth sub word line signals SWL<5:8>, as well as the first to fourth sub word line signals SWL<1:4> included in the first group, are enabled in a high voltage level.

When the twelfth and thirteenth address signals Add<12:13> of a low voltage level are inputted, only the eleventh SWL pre-decoding signal Pre_SWL<11> is enabled in a high voltage level. The SWL decoder 34, which receives the eleventh SWL pre-decoding signal Pre_SWL<11> of a high voltage level and the twelfth to fourteenth SWL pre-decoding signals Pre_SWL<13> of a low voltage level, enables the first sub word line signal SWL<1> and the fifth sub word line signal SWL<5> in a high voltage level, thereby enabling the first and fifth sub word lines. At this time, the data voltage level stored in the second, third, fourth, sixth, seventh and eighth sub word lines in decreased due to the leakage current which is increased by the neighbor/passing gate effect. Accordingly, at step S12, the generation of the refresh failure is screened by reading out the data voltage level stored in memory cells connected to the second, third, fourth, sixth, seventh and eighth sub word lines. That is, a state where the refresh cannot be carried out is verified because the data stored in memory cells connected to the second, third, fourth, sixth, seventh and eighth sub word lines are decreased below a predetermined voltage level.

Subsequently, at step S13, after disabling the first and fifth sub word lines, the second and sixth sub word lines are enabled. More detailed description of this will be omitted because this is set forth above through the enabling process of the first and fifth sub word lines. In a state where the second and sixth sub word lines are enabled, the refresh failure is screened by reading out the data stored in memory cells connected to the first, third, fourth, fifth, seventh and eighth sub word lines at step S14.

Similarly, after the third and seventh sub word lines are enabled at step S15, the data stored in memory cells connected to the first, second, fourth, fifth, sixth and eighth sub word lines are read out at step S16 and, after enabling the fourth and eighth sub word lines at step S17, the refresh failure is screened by reading out the data stored in memory cells connected to the first, second, third, fifth, sixth and seventh sub word lines at step S18.

As apparent from the above, the refresh characteristic test circuit according to the present invention can verify that the refresh failure is caused by the leakage current of the neighbor/passing gate effect, by reading out the data stored in memory cells connected to other sub word lines after selecting two from eight sub word lines and enabling the selected sub word lines, wherein the two selected sub word lines are taken by the sub word lines which do not have influence of the neighbor/passing gate effect on each other.

While the present invention has been described with respect to the particular embodiments, it will be apparent to those skilled in the art that various changes and modifications may be made without departing from the spirit and scope of the invention as defined in the following claims.

This disclosure claims priority to Korean application 10-2007-0083696, filed on Aug. 20, 2007, the entire contents of which are incorporated herein by reference.

What is claimed is:

1. A semiconductor memory device having a refresh characteristic test circuit, the refresh characteristic test circuit comprising:
   a select signal generating unit for receiving first address signals and a test mode signal and generate select signals to select cell blocks;
   a main word line signal generating unit for receiving second address signals and the test mode signal and generate main word lines signals to select main word lines of the selected cell block; and
   a sub word line signal generating unit for receiving third address signals and the test mode signal and enable sub word lines of the selected main word line,
   wherein sub word line signal generating unit comprises:
      a first pre-decoder configured to pre-decode one part of first address signals in response to a test mode signal, and generate first pre-decoding signals to select a first group of adjacent sub word lines and a second group of adjacent sub word lines;
      a second pre-decoder configured to pre-decode the other part of the first address signals in response to the test mode signal, and generate second pre-decoding signals; and
      a decoder configured to decode the first pre-decoding signals and the second pre-decoding signals to enable a first sub word line of the first group and a fifth sub word line of the second group at a first time, enable a second sub word line of the first group and a sixth sub word line of the second group at a second time, enable a third sub word line of the first group and a seventh sub word line of the second group at a third time, and enable a fourth sub word line of the first group and an eight sub word line of the second group at a fourth time,
   wherein the first to eight sub word lines are associated with a selected main word line, and
   wherein said first, second, third and forth times are different from each other.

2. The semiconductor memory device of claim 1, wherein the select signal generating unit generates the select signals to select all of the cell blocks of the semiconductor memory device in response to the test mode signal.

3. The semiconductor memory device of claim 1, wherein the main word line signal generating unit generates the main word line signals to select all of the main word lines of the semiconductor memory device in response to the test mode signal.

4. The semiconductor memory device of claim 3, wherein the main word line signal generating unit includes:
   a pre-decoder for generating third pre-decoding signals by pre-decoding third address signals in response to the test mode signal; and
   a decoder for generating the main word line signals by decoding the third pre-decoding signals.

5. The semiconductor memory device of claim 4, wherein all of the third pre-decoding signals are enabled in response to the test mode signal.

6. The semiconductor memory device of claim 2, wherein the select signal generating unit includes:
   a pre-decoder for generating third pre-decoding signals by pre-decoding second address signals in response to the test mode signal; and
   a decoder for generating the select signals by decoding the plurality of pre-decoding signals.

7. The semiconductor memory device of claim 6, wherein all of the third pre-decoding signals are enabled in response to the test mode signal.

* * * * *